(12) United States Patent
Kim et al.

(10) Patent No.: US 7,420,836 B1
(45) Date of Patent: Sep. 2, 2008

(54) SINGLE-ENDED MEMORY CELL WITH IMPROVED READ STABILITY AND MEMORY USING THE CELL

(75) Inventors: Keunwoo Kim, Somers, NY (US); Rajiv V. Joshi, Yorktown Heights, NY (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/674,292

(22) Filed: Feb. 13, 2007

(51) Int. Cl.
*G11C 11/40* (2006.01)
(52) U.S. Cl. .................. 365/154; 365/230.05
(58) Field of Classification Search .......... 365/155
See application file for complete search history.

(56) References Cited

U.S. PATENT DOCUMENTS

| | | | | |
|---|---|---|---|---|
| 5,592,414 | A * | 1/1997 | Soneda et al. | 365/189.15 |
| 5,790,461 | A * | 8/1998 | Holst | 365/189.04 |
| 6,091,626 | A * | 7/2000 | Madan | 365/154 |
| 2005/0226084 | A1 | 10/2005 | Hong | |
| 2006/0274569 | A1 * | 12/2006 | Joshi et al. | 365/154 |

OTHER PUBLICATIONS

Wang et al., "Single-Ended SRAM with High Test Coverage and Short Test Time," IEEE Journal of Solid-State Circuits, vol. 35, No. 1, pp. 114-118 (Jan. 2000).

* cited by examiner

*Primary Examiner*—Tan T. Nguyen
(74) *Attorney, Agent, or Firm*—Ryan, Mason & Lewis, LLP

(57) ABSTRACT

A memory cell for interconnection with READ and WRITE word lines and READ and WRITE bit lines includes a logical storage element such as a flip-flop formed by a first inverter and a second inverter cross-coupled to the first inverter. The storage element has first and second terminals and a storage element supply voltage terminal configured for interconnection with a first supply voltage. A WRITE access device is configured to selectively interconnect the first terminal to the WRITE bit line under control of the WRITE word line, and a pair of series READ access devices are configured to ground the READ bit line when the READ word line is active and the second terminal is at a high logical level. A logical "one" can be written to the storage element when a second supply voltage, greater than the first supply voltage, is applied to the WRITE word line, substantially without the use of a complementary WRITE bit line.

18 Claims, 8 Drawing Sheets

Comparisons with 6T and 8T

|  | 6T | 8T | Proposed 7T |
|---|---|---|---|
| Read Stability | Poor | Good | Good |
| Area | Small | Large | Medium |
| Scalability | Poor | Good | Good |
| Leakage | - | - | Lower due to use of low VDD |

SINGLE-ENDED MEMORY CELL WITH IMPROVED READ STABILITY AND MEMORY USING THE CELL

FIELD OF THE INVENTION

The present invention generally relates to electronic circuitry and, more particularly, to electronic memory circuits.

BACKGROUND OF THE INVENTION

Issues regarding READ stability and stability in the half-select condition are limiting further scaling of conventional six-transistor (6T) static random access memory (SRAM) cells and circuits. Indeed, due to increased process variations including random mismatch, the READ and half-select stabilities are significantly lower in present and predicted future technologies, as compared to past technologies. Improvement of stability without significant area and/or power penalty is desirable.

Representative prior-art approaches are those set forth in Wang et al, "Single-Ended SRAM with High Test Coverage and Short Test Time," *IEEE Journal of Solid-State Circuits*, v. 35 n.1, January 2000, and in U.S. patent application Publication 2005/0226084 of Hong entitled "Dual Port SRAM Cell." FIG. 1 shows a typical prior-art single-ended eight-transistor (8T) SRAM cell 100. The cell 100 is interconnected with READ and WRITE word lines RWL, WWL, numbered 102, 104, a READ bit line RBLb, numbered 106, true and complementary WRITE bit lines WBL, WBLb, numbered 108, 136, a supply voltage VDD, numbered 110, and a ground 112. The ground can be broadly understood to encompass terminals maintained at a relative ground and not necessarily at zero electrical potential. The cell 100 includes a first inverter formed by transistors PL, NL, numbered 114, 116, and a second inverter formed by transistors PR, NR, numbered 118, 120, cross-coupled to the first inverter to form a storage flip-flop having first and second terminals 122, 124 and a flip-flop supply voltage terminal configured for interconnection with the first supply voltage VDD, numbered 110 Cell 100 also includes a left-hand WRITE access device SL, numbered 126, and configured to selectively interconnect the first terminal 122 to the WRITE bit line 108 under control of the WRITE word line 104.

Cell 100 further includes a pair of series READ access devices N1, N2, numbered 128, 130, configured to ground the READ bit line 106 when the READ word line 102 is active and the second terminal 124 is at a high logical level. Also included is a right-hand WRITE access device SR, numbered 132, which selectively connects second terminal 124 to complementary WRITE bit line 136 under control of WRITE word line 104. All the transistors are n-type field effect transistors (NFETS) except for PL and PR, which are p-type field effect transistors (PFETS). Prior art cell 100 is stable during a READ operation, as the node voltage is not disturbed. However, it has a larger area than the conventional 6T SRAM cell, due to the extra two NFETS N1, N2, and the additional bit line RBLb and word line RWL.

Accordingly, it would be desirable to further improve upon prior art techniques.

SUMMARY OF THE INVENTION

Principles of the present invention provide techniques for implementing a single-ended memory cell with improved READ stability, a memory using the cell, and methods of operating and designing same. An exemplary embodiment of a memory cell for interconnection with READ and WRITE word lines, READ and WRITE bit lines, a first supply voltage, and a second supply voltage, includes a logical storage element such as a flip-flop formed by a first inverter and a second inverter cross-coupled to the first inverter. The logical storage element has first and second terminals and a storage element supply voltage terminal configured for interconnection with the first supply voltage. The exemplary inventive cell further includes a WRITE access device configured to selectively interconnect the first terminal to the WRITE bit line under control of the WRITE word line, and a pair of series READ access devices configured to ground the READ bit line when the READ word line is active and the second terminal is at a high logical level.

The cell is configured to permit writing of a logical "one" to the storage element when the second supply voltage is applied to the WRITE word line and is greater than the first supply voltage, substantially without the use of a complementary WRITE bit line (inherently, no prior-art SR device is needed).

In anther aspect, an exemplary inventive memory circuit includes a plurality of word line structures comprising READ and WRITE word lines, a plurality of bit line structures comprising READ and WRITE bit lines and intersecting the word line structures at a plurality of cell locations, and a voltage supply configured to supply a first supply voltage, and a second supply voltage. The circuit includes a plurality of the inventive cells described above, formed at the cell locations. The circuit further includes control circuitry coupled to the voltage supply and configured to permit writing of a logical "one" to the logical storage element of a given one of the cells by applying the second supply voltage to the corresponding one of the WRITE word lines and applying the first supply voltage to the storage element supply voltage terminal, the second supply voltage being greater than the first supply voltage, substantially without the use of a complementary WRITE bit line.

In yet another aspect, an exemplary method for operating a memory circuit includes the steps of providing a memory circuit of the kind described, and writing a logical "one" to a logical storage element of a given one of the cells of the circuit by applying the second supply voltage to the corresponding one of the WRITE word lines and applying the first supply voltage to the storage element supply voltage terminal, the second supply voltage being greater than the first supply voltage, substantially without the use of a complementary WRITE bit line.

In still another aspect, an exemplary method (which can be computer-implemented) of designing a memory circuit of the kind described includes the steps of determining a WRITE word line voltage sufficient to turn on the access device SL, and storing the voltage value in memory in a form for subsequent use.

These and other objects, features and advantages of the present invention will become apparent from the following detailed description of illustrative embodiments thereof, which is to be READ in connection with the accompanying drawings.

BRIEF DESCRIPTION OF THE DRAWINGS

FIG. 3 is chart comparing an exemplary inventive embodiment with prior-art approaches, the comparison being for illustrative purposes and not to be taken as limiting;

DETAILED DESCRIPTION OF PREFERRED EMBODIMENTS

Figure 1:
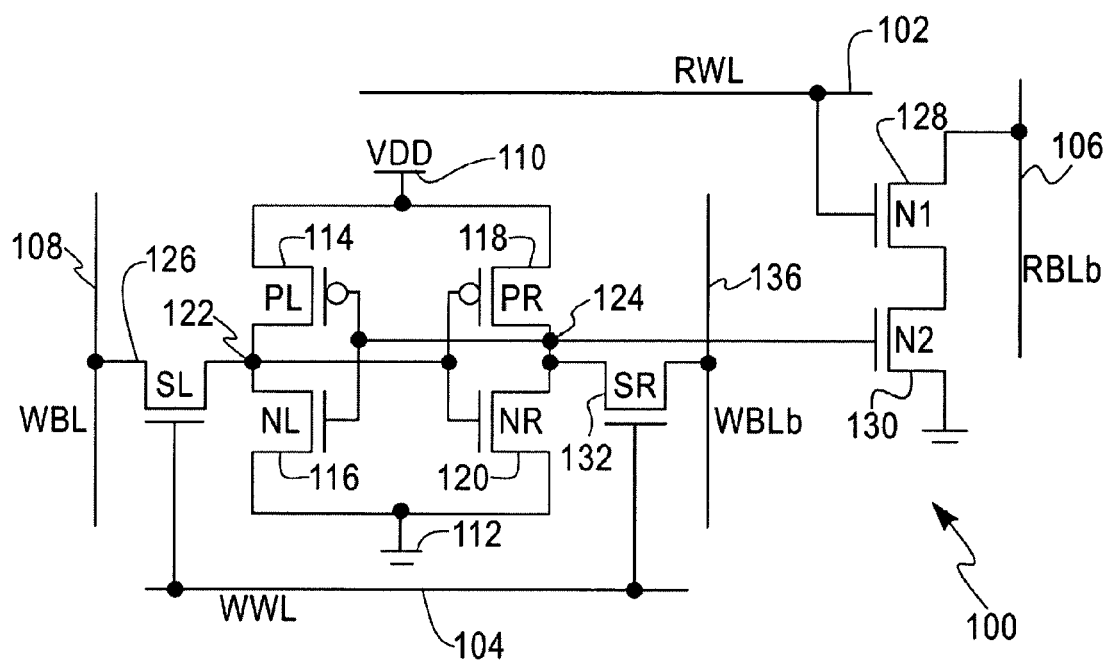
FIG. 1 shows a prior-art singled-ended 8T SRAM cell.
Figure 2:
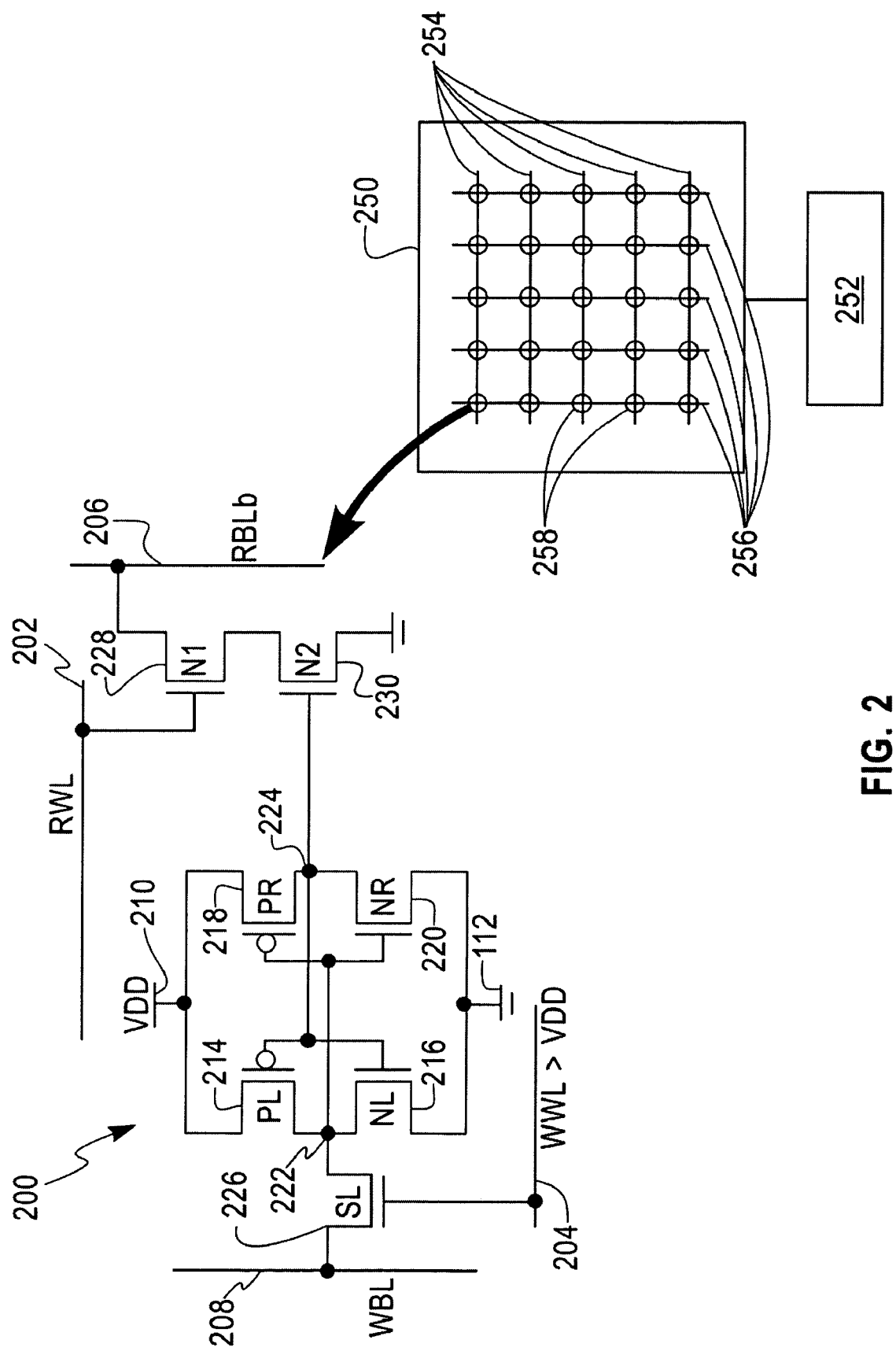
FIG. 2 shows an exemplary embodiment of an inventive single-ended cell and an exemplary circuit using same.

Attention should now be given to FIG. 2, which shows an exemplary embodiment of an inventive single-ended cell and an exemplary circuit using same. Elements similar to those in FIG. 1 have received the same reference character incremented by one hundred, and will not be described again except to the extent that they differ substantially therefrom. Unlike the prior art cell 100, inventive cell 200 employs a first supply voltage VDD, and a second supply voltage, and is configured to permit writing of a logical "one" to the flip-flop when the second supply voltage is applied to the WRITE word line 204 and is greater than the first supply voltage VDD. The inventive cell 200 accomplishes this substantially without the use of a complementary WRITE bit line 136, and thus, inherently, no prior art SR device 132 is needed. Please note that the exemplary embodiment set forth herein is described in terms of cells employing flip-flops formed by cross-coupled inverters. However, the flip-flop is just one example of a logical storage element, and the flip-flop terminals are examples of storage element terminals.

The exemplary inventive cell 200 is a seven-transistor (7T) cell, and in one or more embodiments, can have less area than the prior-art 8T cell 100, while having comparable or only slightly higher area than the prior-art 6T cell. In one or more embodiments, VDD can be reduced as compared to prior art approaches, due to the superior signal-to-noise margin (SNM) of one or more embodiments of the invention. Further, in one or more embodiments, the lower VDD can result in reduced cell leakage and reduced power requirements, and can increase the reliability of the cell transistors. Further, in one or more embodiments, the use of voltage on the WRITE WORD LINE 204 greater than VDD will improve the WRITE operation.

In one or more embodiments, the first inverter comprises a first inverter pull-up field-effect transistor (FET) 214 having a relatively high threshold voltage coupled to a first inverter pull-down FET 216 having a relatively high threshold voltage, and the second inverter comprises a second inverter pull-up FET 218 having a relatively high threshold voltage coupled to a second inverter pull-down FET 220 having a relatively high threshold voltage. The WRITE access device 226 can be a FET having a relatively high threshold voltage, and the pair of series READ access devices 228, 230 can be FETs having substantially regular threshold voltages. "Relatively high" and "substantially regular" are with respect to logic devices. In one or more embodiments, the threshold voltage of access transistor 226 is preferably greater than that of pull-down FET 216.

In one or more embodiments, the cell is configured to permit writing of the logical "one" to the flip-flop when the second supply voltage value on the WRITE word line ($V_{w1}$) is sufficiently greater than the first supply voltage VDD to turn on the passgate SL 226 Further, the cell can be configured to permit writing of a logical "zero" when a substantially uniform zero-writing voltage is applied to the flip-flop supply voltage terminal 210 and the WRITE word line 204; the zero-writing voltage can be, for example, substantially equal to the first supply voltage VDD. However, in another possible approach, the zero-writing voltage is substantially equal to the second supply voltage. As discussed further below, it is presently believed preferable to decrease VDD for writing "one," in order to further decrease the "on" current, $I_{on}$, and reduce leakage—the pull-up devices 214, 218 can have lower VDD, as well as the bitlines, which helps in writeability.

In one or more embodiments, the first inverter comprises a first inverter pull-up field-effect transistor (FET) 214 coupled to a first inverter pull-down FET 216, the second inverter comprises a second inverter pull-up FET 218 coupled to a second inverter pull-down FET 220, the WRITE access device 226 comprises a FET, and the WRITE access device is sized, relative to the first inverter pull-down FET 216, to enhance reliability of the WRITE operation. This can be done, for example, by appropriate selection of the ratio Rds (passgate)/Rds(pulldown), where Rds is the drain-source resistance, and the term "passgate" refers to the WRITE access device. In one or more embodiments, the ratio can be optimized.

Inventive memory cells can be formed into a memory circuit comprising an array of cells 250 and circuitry 252. The array of cells can include a plurality of word line structures 254, comprising, for example, READ and WRITE word lines 202, 204, and a plurality of bit line structures 256 comprising, for example, READ and WRITE bit lines 206, 208 and intersecting the word line structures 254 at a plurality of cell locations indicated by circles 258. The cells can be of the kind described. Circuitry 252 can include, for example, a voltage supply configured to supply a first supply voltage VDD, and a second supply voltage, as discussed above, as well as control circuitry. The control circuitry can be coupled to the voltage supply and configured to permit writing of a logical "one" to the flip-flop of a given one of the cells by applying the second supply voltage to the corresponding one of the WRITE word lines and applying the first supply voltage VDD to the flip-flop supply voltage terminal, the second supply voltage being greater than the first supply voltage, substantially without the use of a complementary WRITE bit line, as discussed above. Construction of circuitry 252 will be apparent to the skilled artisan given the teachings herein.

Based on the discussion thus far, it will be appreciated that in one or more inventive embodiments, writing a "zero" can be accomplished using the same supply voltage level for both VDD and the WRITE word line 204. However, the voltage applied to the WRITE word line 204 must be significantly increased compared to VDD, or VDD significantly lowered compared to the WRITE word line voltage, in order to WRITE a "one." The latter case is believed preferable, since lower VDD will result in a more substantial decrease in $I_{on}$ in a device close to the sub-$V_t$ regime, and the lower VDD should yield lower leakage. The aforementioned proper sizing the SL and NL can enhance the reliability of the WRITE operation. Further, use of a regular value of Vt for NL makes SL relatively stronger, which cannot be achieved in conventional 6T approaches. The appropriate selection of VDD and the second supply voltage, using the techniques and considerations described herein, is believed to be significant.

FIG. 3 compares an exemplary embodiment of the 7T cell with prior-art 6T and 8T cells, in terms of READ stability, area, scalability, and leakage. It is to be understood that the comparison is applicable to one or more exemplary implementations of the invention, and is not meant to suggest that every embodiment of the invention must necessarily compare in the same way.

Figure 4:
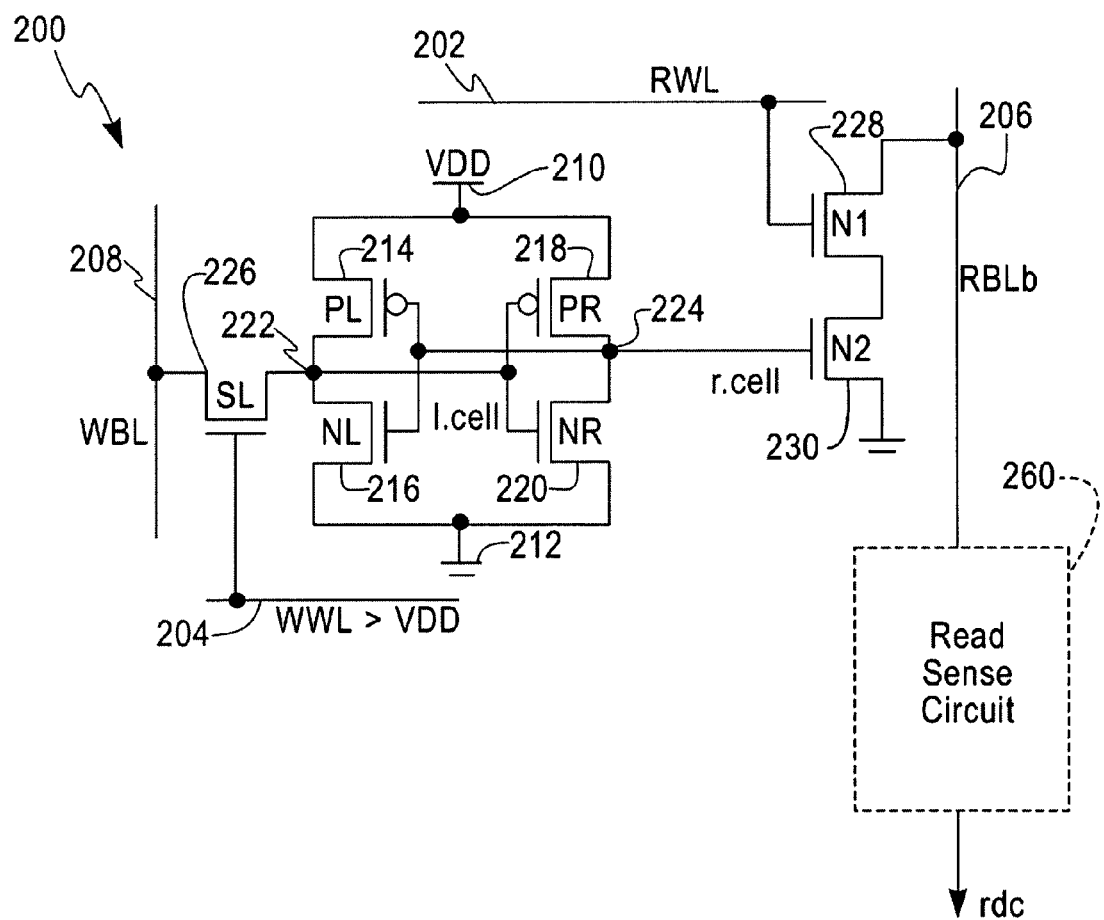
FIG. 4 shows the exemplary cell of FIG. 2 coupled to a READ sense circuit.

FIG. 4 repeats FIG. 2, but with array 250 and circuitry 252 omitted to show an exemplary READ sense circuit 260, which can be interconnected with READ bit line 206 and appropriately implemented within circuitry 252. The signal from line 206 is sensed by circuit 260, and the resultant output is designated "rdc."

Figure 5:
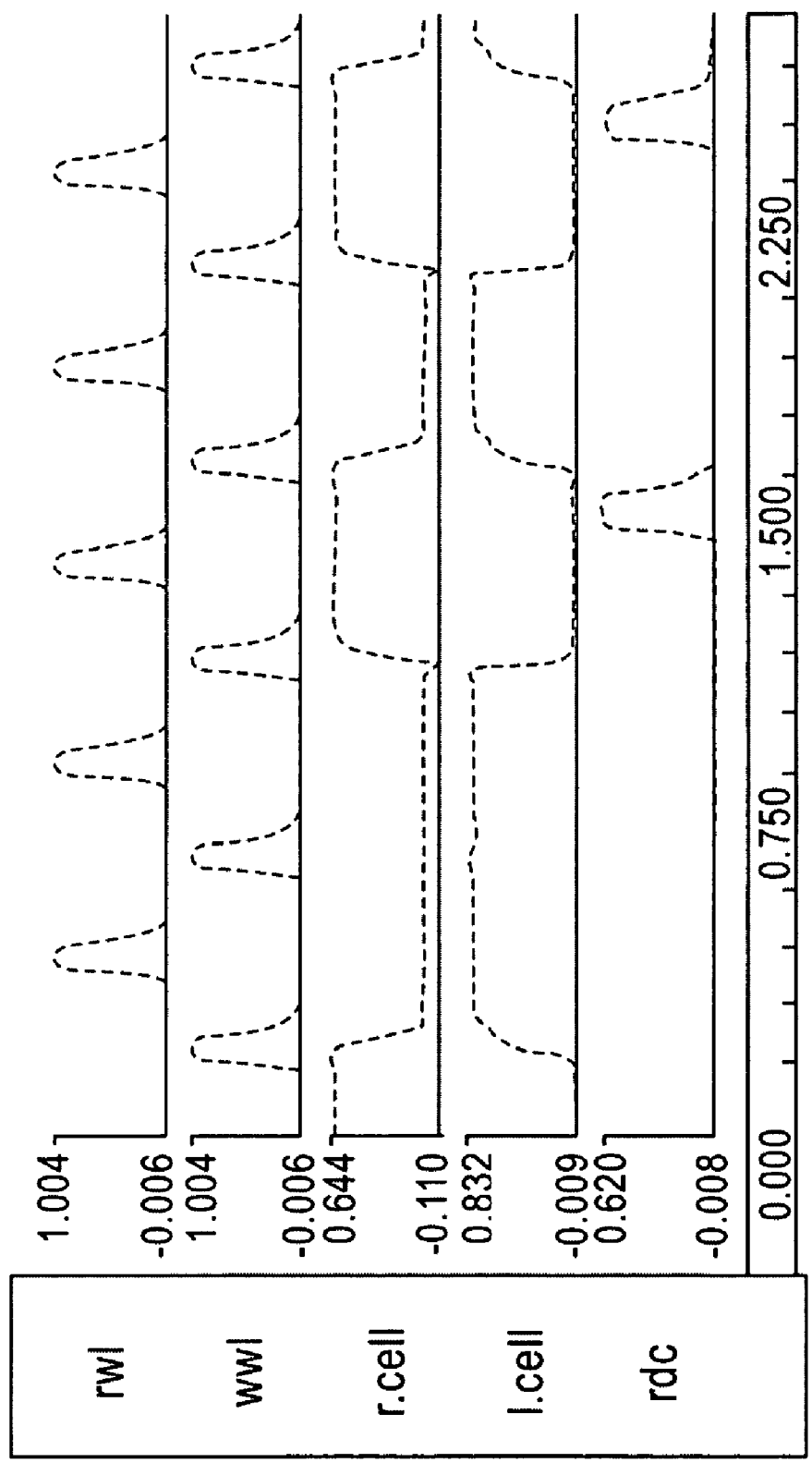
FIG. 5 presents waveforms showing READ and WRITE operations of an embodiment of the invention.

FIG. 5 shows the voltage waveforms on the READ word line (rwl), write word line (wwl), first flip-flop terminal 222 (l.cell), second flip-flop terminal 224 (r.cell), and output rdc of circuit 260 The results are for exemplary purposes, not to be taken as limiting, and reflect a VDD of about 0.6V. When r.cell=1, l.cell=0 and the output rdc=0. Thus, whatever is on the left side of the cell shows on the output. In a dual READ bitline case there would be a complementary value on the other side.

Figure 6:
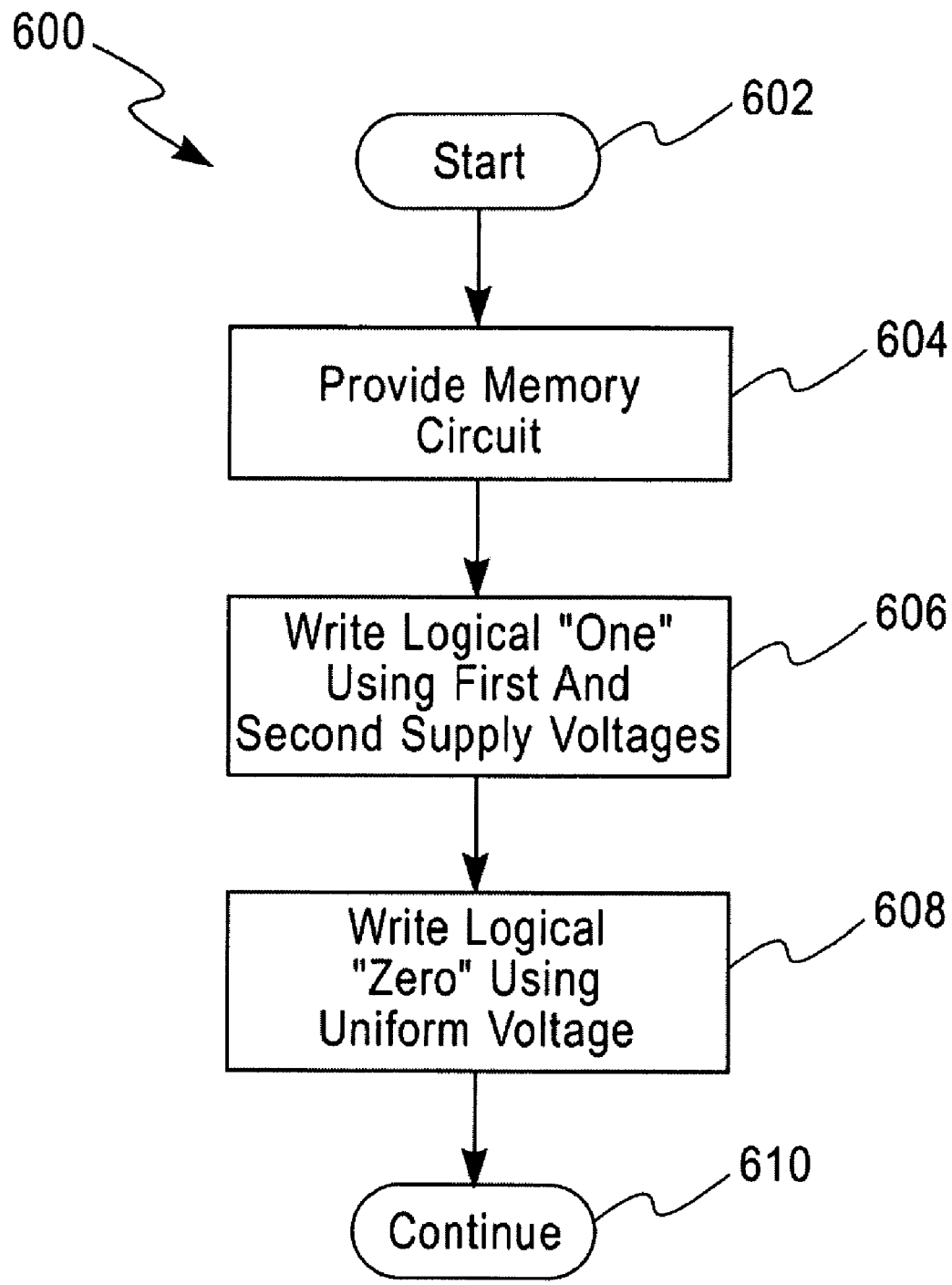
FIG. 6 shows a flow chart of exemplary method steps of an inventive method of circuit operation.

Attention should now be given to FIG. 6, which shows a flow chart 600 of exemplary method steps in a method for operating a memory circuit. After beginning at block 602, a memory circuit of the kind described herein is provided at block 604. At block 606, a logical "one" is written to the flip-flop of a given one of the cells by applying the second supply voltage to the corresponding one of the WRITE word lines and applying the first supply voltage VDD to the flip-flop supply voltage terminal, the second supply voltage being greater than the first supply voltage, substantially without the use of a complementary WRITE bit line (as noted above, this inherently means that no SR device is needed). The second supply voltage, applied to the WRITE word line, is sufficiently greater than the first supply voltage VDD to turn on the WRITE access device. At block 608, the logical "zero" is written, in some embodiments, by applying the substantially uniform zero-writing voltage to the flip-flop supply voltage terminal and the corresponding one of the WRITE word lines, the zero-writing voltage being substantially equal to the first supply voltage VDD. As noted above, in other embodiments, the logical "zero" is written by applying the substantially uniform zero-writing voltage to the flip-flop supply voltage terminal and the corresponding one of the WRITE word lines, the zero-writing voltage being substantially equal to the second supply voltage. The method continues at block 610

Figure 7:
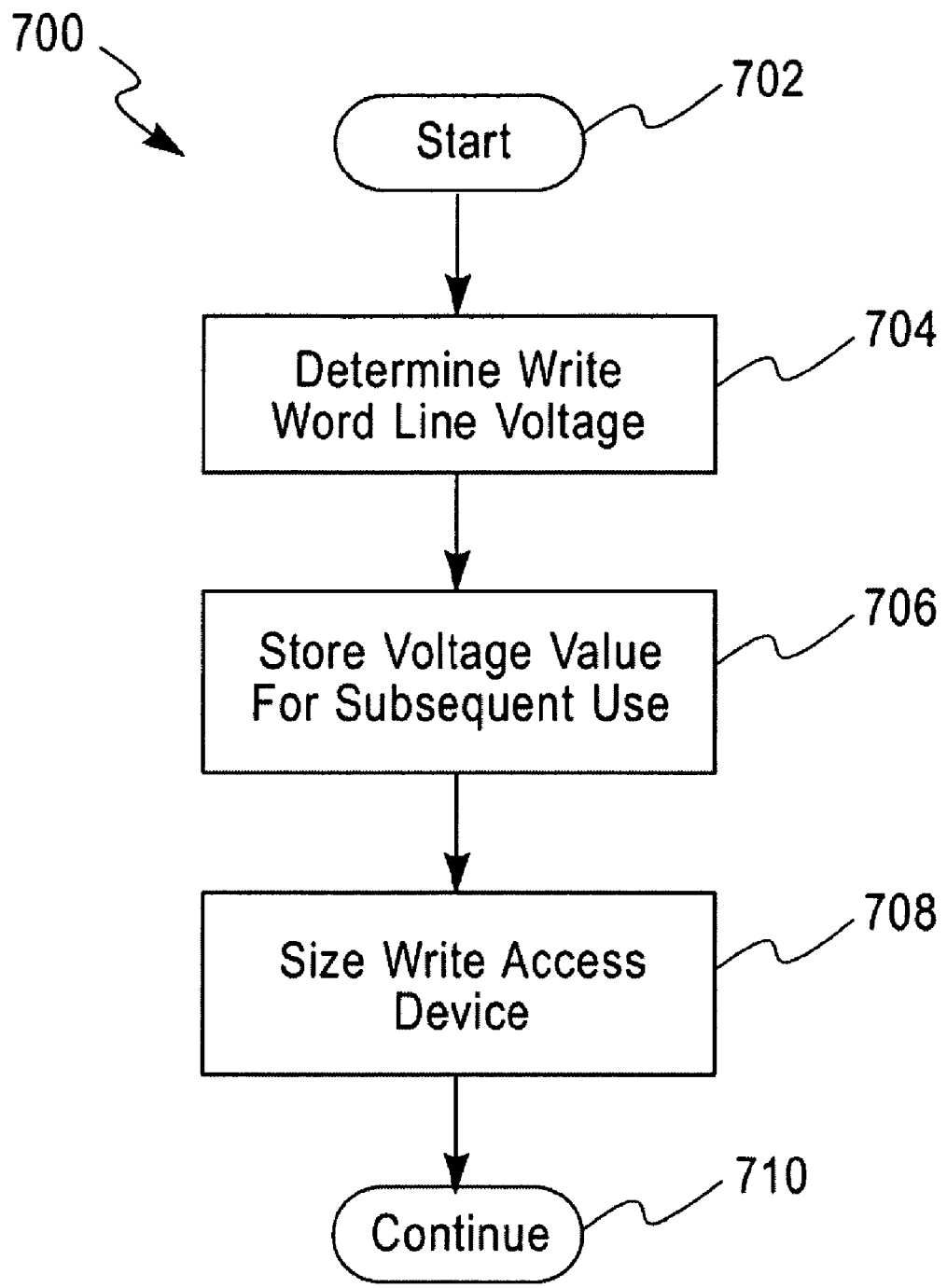
FIG. 7 shows a flow chart of exemplary method steps of an inventive method of circuit design.

With attention now to FIG. 7, in yet another aspect, a flow chart 700 of exemplary steps in a computer-implemented method of designing a memory circuit having at least one memory cell of the kind described herein is depicted. After beginning at block 702, at block 704, a WRITE word line voltage is determined, the voltage to be applied to the WRITE word line and sufficient to turn on the WRITE access device under conditions when the logical "one" is to be written. At block 706, the voltage is stored in memory in a form for subsequent use. Optionally, other determinations can be made by a computer-aided design (CAD) program based on criteria set forth herein. For example, in block 708, calculations can be performed to size the WRITE access device, relative to the first inverter pull-down FET, to enhance reliability of the WRITE operation. Processing continues at block 710.

Figure 8:
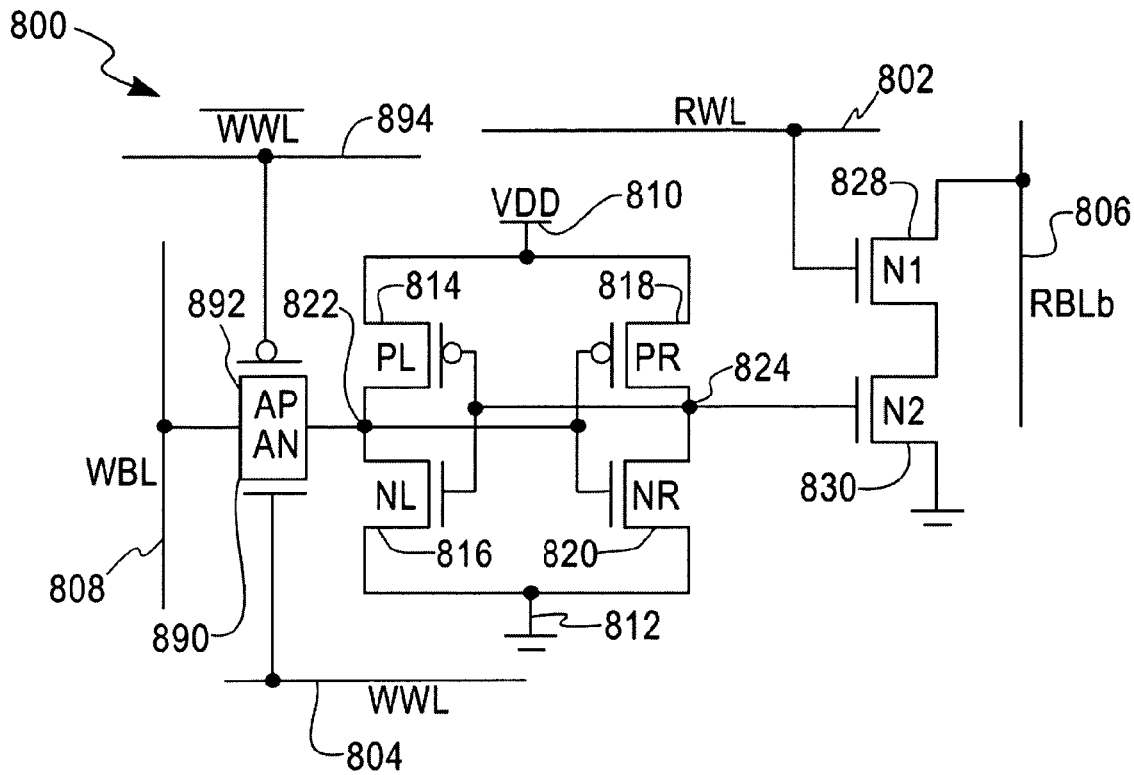
FIG. 8 shows an exemplary alternative embodiment of an inventive single-ended cell, using a transmission gate.

FIG. 8 shows an embodiment of a cell 800 similar to that of FIG. 2, with similar items having the same reference character incremented by six hundred, and not described again except to the extent they differ substantially from FIG. 2. Items 250-258 are not replicated, it being understood that the cell 800 of FIG. 8 can be employed in a memory circuit using similar principles as outlined with regard to FIG. 2. In the embodiment of FIG. 8, instead of element 226 of FIG. 2, a transmission gate formed by NFET 890 and PFET 892 is employed. NFET 890 has its gate coupled to true WRITE word line 804 and PFET 892 has its gate coupled to complementary WRITE word line 894. It should be understood that in general, access can be controlled by NFET 226 of FIG. 2, or by the transmission gate depicted in FIG. 8, or by a PFET 892 only under control of a (complementary) WORD line, such as 894, which would have the complement of the signal for an NFET. In the case of only a PFET being used, the WORD line can be thought of a simply a WORD line, even though it has a signal that is the complement of what would be used for the gate of an NFET. FETS 890, 892 each have first drain-source terminals coupled to WRITE bit line 808 and second drain-source terminals coupled to node 822. The signal on complementary line 894 can be one when that on line 804 is zero, and vice-versa. As used herein, including the claims, a complementary value of the second supply voltage during the writing of a logical "one" would generally constitute the appropriate "low" logical level, such as, for example, zero volts.

The circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare dye or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

A variety of techniques, utilizing dedicated hardware, general purpose processors, firmware, software, or a combination of the foregoing may be employed to implement one or more aspects of the present invention (for example, the CAD techniques). One or more embodiments of the invention can be implemented in the form of a computer product including a computer usable medium with computer usable program code for performing the method steps indicated. Furthermore, one or more embodiments of the invention can be implemented in the form of an apparatus including a memory and at least one processor that is coupled to the memory and operative to perform exemplary method steps.

Figure 9:
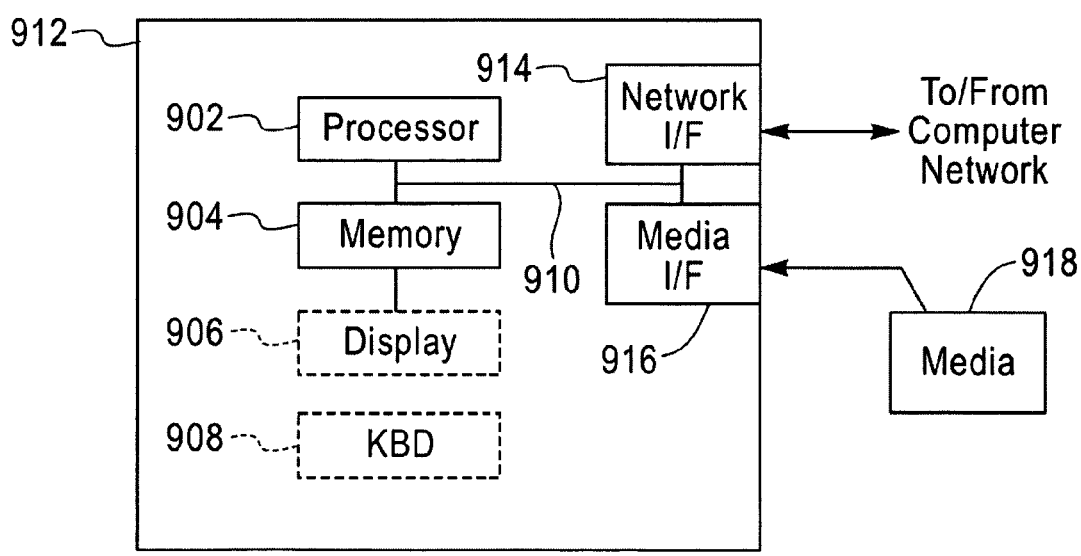
FIG. 9 shows an exemplary computer system useful in one or more aspects of the invention, such as in practicing the inventive circuit design method.

At present, it is believed that one or more embodiments will make substantial use of software running on a general purpose computer or workstation. With reference to FIG. 9, such an implementation might employ, for example, a processor 902, a memory 904, and an input/output interface formed, for example, by a display 906 and a keyboard 908. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (READ only memory), a fixed memory device (e.g., hard drive), a removable memory device (e.g., diskette), a flash memory and the like. In addition, the phrase "input/output interface" as used herein, is intended to include, for example, one or more mechanisms for inputting data to the processing unit (e.g., mouse), and one or more mechanisms for providing results associated with the processing unit (e.g., printer). The processor 902, memory 904, and input/output interface such as display 906 and keyboard 908 can be interconnected, for example, via bus 910 as part of a data processing unit 912. Suitable interconnections, for example via bus 910, can also be provided to a network interface 914, such as a network card, which can be provided to interface with a computer network, and to a media interface 916, such as a diskette or CD-ROM drive, which can be provided to interface with media 918.

Accordingly, computer software including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU. Such software could include, but is not limited to, firmware, resident software, microcode, and the like Furthermore, the invention can take the form of a computer program product accessible from a computer-usable or computer-readable medium (e.g., media 918) providing program code for use by or in connection with a computer or any instruction execution system. For the purposes of this description, a computer usable or computer readable medium can be any apparatus for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory (e.g. memory 904), magnetic tape, a removable computer diskette (e.g. media 918), a random access memory (RAM), a read-only memory (ROM), a rigid magnetic disk and an optical disk. Current examples of optical disks include compact disk-READ only memory (CD-ROM), compact disk-read/WRITE (CD-R/W) and DVD.

A data processing system suitable for storing and/or executing program code will include at least one processor 902 coupled directly or indirectly to memory elements 904 through a system bus 910. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 908, displays 906, pointing devices, and the like) can be coupled to the system either directly (such as via bus 910) or through intervening I/O controllers (omitted for clarity).

Network adapters such as network interface 914 may also be coupled to the system to enable the data processing system to become coupled to other data processing systems or remote printers or storage devices through intervening private or public networks. Modems, cable modem and Ethernet cards are just a few of the currently available types of network adapters.

In any case, it should be understood that the components illustrated herein may be implemented in various forms of hardware, software, or combinations thereof, e.g., application specific integrated circuit(s) (ASICS), functional circuitry, one or more appropriately programmed general purpose digital computers with associated memory, and the like. Further, it will be appreciated and should be understood that the exemplary embodiments of the invention described above can be implemented in a number of different fashions. Given the teachings of the invention provided herein, one of ordinary skill in the related art will be able to contemplate other implementations of the invention and/or its components.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A memory cell for interconnection with READ and WRITE word lines, READ and WRITE bit lines, a first supply voltage VDD, and a second supply voltage, said cell comprising:
   a logical storage element having first and second terminals and a storage element supply voltage terminal configured for interconnection with the first supply voltage VDD;
   a WRITE access device configured to selectively interconnect said first terminal to the WRITE bit line under control of the WRITE word line; and
   a pair of series READ access devices configured to ground the READ bit line when the READ word line is active and said second terminal is at a high logical level; wherein:
   said cell is configured to permit writing of a logical "one" to said logical storage element when the second supply voltage is applied to the WRITE word line and is greater than the first supply voltage VDD, substantially without the use of a complementary WRITE bit line.

2. The memory cell of claim 1, wherein said logical storage element comprises a storage flip-flop, said flip-flop in turn comprising a first inverter and a second inverter cross-coupled to said first inverter to form said flip-flop, wherein said storage element supply voltage terminal comprises a flip-flop supply voltage terminal.

3. The memory cell of claim 2, wherein:
   said first inverter comprises a first inverter pull-up field-effect transistor (FET) having a relatively high threshold voltage coupled to a first inverter pull-down FET having a relatively high threshold voltage;
   said second inverter comprises a second inverter pull-up FET having a relatively high threshold voltage coupled to a second inverter pull-down FET having a relatively high threshold voltage;
   said WRITE access device comprises a FET having a relatively high threshold voltage; and said pair of series READ access devices comprise FETs having substantially regular threshold voltages.

4. The memory cell of claim 2, wherein said cell is configured to permit writing of said logical "one" to said flip-flop when said second supply voltage, applied to said WRITE word line, is sufficiently greater than the first supply voltage VDD to turn on said WRITE access device.

5. The memory cell of claim 4, wherein said cell is configured to permit writing of a logical "zero" when a substantially uniform zero-writing voltage is applied to said flip-flop supply voltage terminal and said WRITE word line.

6. The memory cell of claim 5, wherein the zero-writing voltage is substantially equal to the first supply voltage VDD.

7. The memory cell of claim 5, wherein the zero-writing voltage is substantially equal to the second supply voltage.

8. The memory cell of claim 2, wherein:
said first inverter comprises a first inverter pull-up field-effect transistor (FET) coupled to a first inverter pull-down FET;
said second inverter comprises a second inverter pull-up FET coupled to a second inverter pull-down FET;
said WRITE access device comprises a FET; and
said WRITE access device is sized, relative to said first inverter pull-down FET, to enhance reliability of said WRITE operation.

9. The memory cell of claim 2, for further interconnection with a complementary WRITE word line, wherein said WRITE access device comprises a transmission gate acting under further control of the complementary WRITE word line.

10. A memory circuit comprising:
a plurality of word line structures comprising READ and WRITE word lines;
a plurality of bit line structures comprising READ and WRITE bit lines and intersecting said word line structures at a plurality of cell locations;
a voltage supply configured to supply a first supply voltage VDD, and a second supply voltage;
a plurality of cells formed at said cell locations, each of said cells comprising:
a logical storage element having first and second terminals and a storage element supply voltage terminal;
a WRITE access device configured to selectively interconnect said first terminal to a corresponding one of said WRITE bit lines under control of a corresponding one of said WRITE word lines; and
a pair of series READ access devices configured to ground a corresponding one of said READ bit lines when a corresponding one of said READ word lines is active and said second terminal is at a logical level; and
control circuitry coupled to said voltage supply and configured to permit writing of a logical "one" to said logical storage element of a given one of said cells by applying said second supply voltage to said corresponding one of said WRITE word lines and applying said first supply voltage VDD to said storage element supply voltage terminal, said second supply voltage being greater than said first supply voltage, substantially without the use of a complementary WRITE bit line.

11. The memory cell of claim 10, wherein, in said cells, said logical storage element comprises a storage flip-flop, said flip-flop in turn comprising a first inverter and a second inverter cross-coupled to said first inverter to form said flip-flop, wherein said storage element supply voltage terminal comprises a flip-flop supply voltage terminal.

12. The memory circuit of claim 11, wherein, in said cells:
said first inverter comprises a first inverter pull-up field-effect transistor (FET) having a relatively high threshold voltage coupled to a first inverter pull-down FET having a relatively high threshold voltage;
said second inverter comprises a second inverter pull-up FET having a relatively high threshold voltage coupled to a second inverter pull-down FET having a relatively high threshold voltage;
said WRITE access device comprises a FET having a relatively high threshold voltage; and
said pair of series READ access devices comprise FETs having substantially regular threshold voltages.

13. The memory circuit of claim 11, wherein said second supply voltage is sufficiently greater than the first supply voltage VDD to turn on said WRITE access device.

14. The memory circuit of claim 11, wherein said cells and said control circuitry are configured to permit writing of a logical "zero" to a given one of said cells by applying a substantially uniform zero-writing voltage to said flip-flop supply voltage terminal and said corresponding one of said WRITE word lines.

15. The memory circuit of claim 14, wherein said zero-writing voltage is substantially equal to said first supply voltage VDD.

16. The memory circuit of claim 14, wherein said zero-writing voltage is substantially equal to said second supply voltage.

17. The memory circuit of claim 11, wherein, in said cells:
said first inverter comprises a first inverter pull-up field-effect transistor (FET) coupled to a first inverter pull-down FET;
said second inverter comprises a second inverter pull-up FET coupled to a second inverter pull-down FET;
said WRITE access device comprises a FET; and
said WRITE access device is sized, relative to said first inverter pull-down FET, to enhance reliability of said WRITE operation.

18. The memory circuit of claim 11, wherein said plurality of word line structures further comprises complementary WRITE word lines, and wherein, in said cells, said WRITE access device comprises a transmission gate acting under further control of the complementary WRITE word line.

* * * * *